United States Patent
Klass et al.

[11] Patent Number: 5,889,417
[45] Date of Patent: Mar. 30, 1999

[54] APPARATUS AND METHOD FOR IMPROVING THE NOISE IMMUNITY OF A DYNAMIC LOGIC SIGNAL REPEATER

[75] Inventors: Edgardo F. Klass, Palo Alto; Chaim Amir, Sunnyvale; David W. Poole, Mountain View; Alan C. Rogers, Palo Alto, all of Calif.

[73] Assignee: Sun Microsystems, Inc., Mountain View, Calif.

[21] Appl. No.: 653,381

[22] Filed: May 24, 1996

[51] Int. Cl.⁶ .......................... H03K 19/096; H03K 17/16
[52] U.S. Cl. ................................................. 326/98; 326/24
[58] Field of Search .................................. 326/95, 97, 98, 326/121, 23, 24

[56] References Cited

U.S. PATENT DOCUMENTS

| | | | |
|---|---|---|---|
| 4,700,086 | 10/1987 | Ling et al. | 326/98 |
| 4,825,106 | 4/1989 | Tipon et al. | 326/98 |
| 5,015,882 | 5/1991 | Houston et al. | 326/98 |
| 5,495,188 | 2/1996 | Chen et al. | 326/98 |
| 5,612,638 | 3/1997 | Lev | 326/98 |

FOREIGN PATENT DOCUMENTS

| | | | |
|---|---|---|---|
| 59-4328 | 1/1984 | Japan | 326/95 |

OTHER PUBLICATIONS

Chen, John Y., "CMOS Devices and Technology for VLSI", copyright 1990 by Prentice–Hall, Inc., pp. 94–97, 1990.

Masakazu Shoji, *CMOS Digital Circuit Technology*, Prentice Hall, NJ (1988) pp. 391–408.

H.B. Bakoglu, *Circuits, Interconnections, and Packaging For VLSI*, Addison Wesley, (1990) pp. 289–303.

*Primary Examiner*—Edward P. Westin
*Assistant Examiner*—Richard Roseen
*Attorney, Agent, or Firm*—William S. Galliani; Flehr Hohbach Test Albritton & Herbert LLP

[57] ABSTRACT

A dynamic logic signal repeater includes a complementary dynamic logic circuit with an input node to receive an input signal and an output node storing a precharge signal. The complementary dynamic logic circuit configuration, transistor sizing, and the use of a precharge driver results in a signal transition trip point for the precharge signal on the output node that is substantially equivalent to the signal transition trip point of a static logic circuit. Thus, the dynamic logic signal repeater has improved noise immunity. An evaluation locking transistor is connected to the complementary dynamic logic circuit and the output node. The evaluation locking transistor prevents the charging of the output node during a dynamic logic evaluation period.

20 Claims, 4 Drawing Sheets

APPARATUS AND METHOD FOR IMPROVING THE NOISE IMMUNITY OF A DYNAMIC LOGIC SIGNAL REPEATER

BRIEF DESCRIPTION OF THE INVENTION

This invention relates generally to signal repeaters that are used to reduce the delay of long lines in integrated circuits. More particularly, this invention relates to a technique for reducing the noise immunity of a dynamic logic signal repeater.

BACKGROUND OF THE INVENTION

Signal repeaters are used in Very Large Scale Integrated (VLSI) circuits to reduce the delay of long lines. A long line is broken into smaller segments and signal repeaters are used to drive a signal between the segments.

When a signal repeater is implemented in dynamic logic, a noise problem arises. The noise problem is due mainly to cross coupling between adjacent lines. A traditional solution to this problem is to increase the distance between the lines. Another approach is to use shielding around the lines. Both of these solutions share the substantive disadvantage of requiring a relatively large amount of space. To avoid this disadvantage, the strength of precharge node feedback devices can be increased. Unfortunately, this approach reduces the speed of the repeater.

In view of the foregoing, it would be highly desirable to develop an improved high noise immunity dynamic logic repeater. The dynamic logic repeater should avoid the space problem associated with distancing or shielding approaches. In addition, the dynamic logic repeater should not sacrifice device speed, as in the case of a high strength precharge node feedback device.

SUMMARY OF THE INVENTION

A dynamic logic signal repeater includes a complementary dynamic logic circuit with an input node to receive an input signal and an output node storing a precharge signal. The complementary dynamic logic circuit configuration, transistor sizing, and the use of a precharge driver results in a signal transition trip point for the precharge signal on the output node that is substantially equivalent to the signal transition trip point of a static logic circuit. Thus, the dynamic logic signal repeater has improved noise immunity. An evaluation locking transistor is connected to the complementary dynamic logic circuit and the output node. The evaluation locking transistor prevents the charging of the output node during a dynamic logic evaluation period.

Thus, the invention provides an improved high noise immunity dynamic logic signal repeater. The dynamic logic signal repeater allows for a device that is more compact than a device that relies upon distancing or shielding to achieve noise immunity. The invention does not sacrifice device speed, as in the case of a high strength precharge node feedback device. Advantageously, the invention can be implemented through modifications to existing dynamic logic signal repeater architectures.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
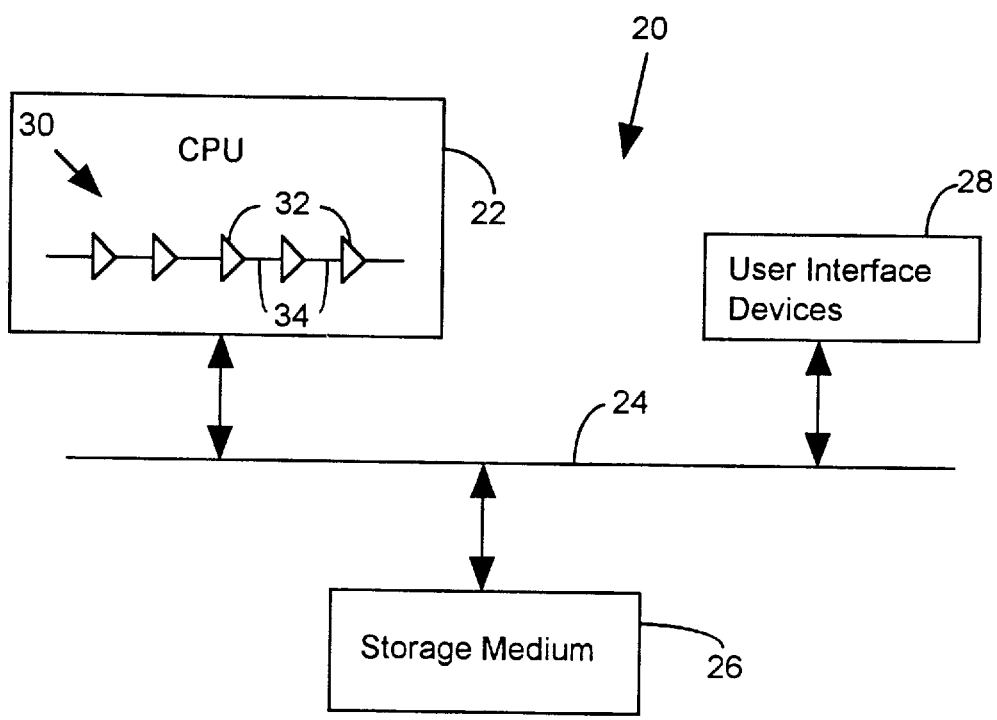
FIG. 1 illustrates a computer incorporating the dynamic signal repeaters of the invention.

FIG. 1 illustrates a computer 20 with a central processing unit (CPU) 22. The CPU 22 is connected to a bus 24 to achieve communication with a storage medium 26, generally including primary memory storage and secondary memory storage. The CPU 22 also uses the bus 24 to communicate with user interface devices 28, generally referring to any computer input or output device. The interaction of a CPU 22, bus 24, storage medium 26, and user interface devices 28 is known in the art. The invention is directed toward a signal repeater line 30 used on the CPU 22. The signal repeater line 30 includes a set of signal repeaters 32 that are connected by conductors 34. A signal repeater line 30 is used to reduce the delay of a long signal path on the CPU 22.

Figure 2:
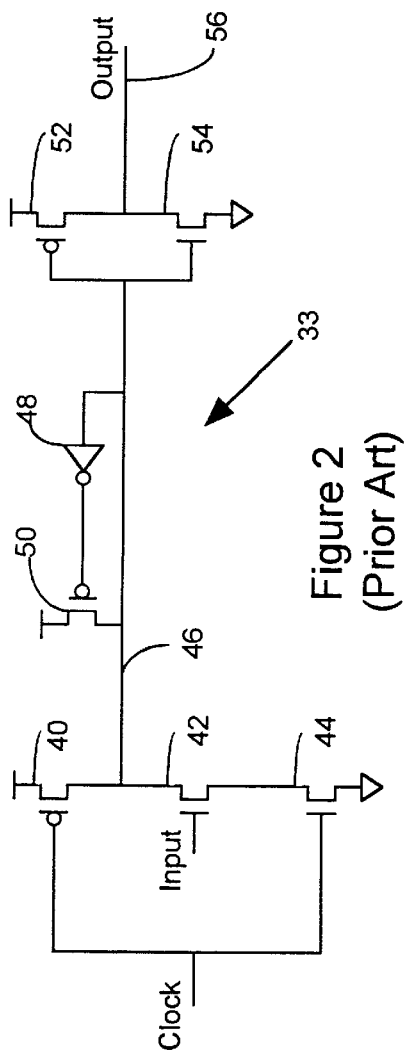
FIG. 2 illustrates a prior art dynamic logic signal repeater.

FIG. 2 illustrates a prior art signal repeater 33. The signal repeater 33 uses dynamic logic. A dynamic logic circuit uses a precharged node to increase switching speed.

The dynamic logic signal repeater 33 of FIG. 2 includes a dynamic logic inverter with transistors 40, 42, and 44. A clock signal is applied to a PMOS transistor 40 and an NMOS transistor 44. A digital low clock signal causes the PMOS transistor 40 to turn-on and the NMOS transistor 44 to turn-off. As a result, the precharge node 46 is charged to the value of the supply voltage.

Figure 3:
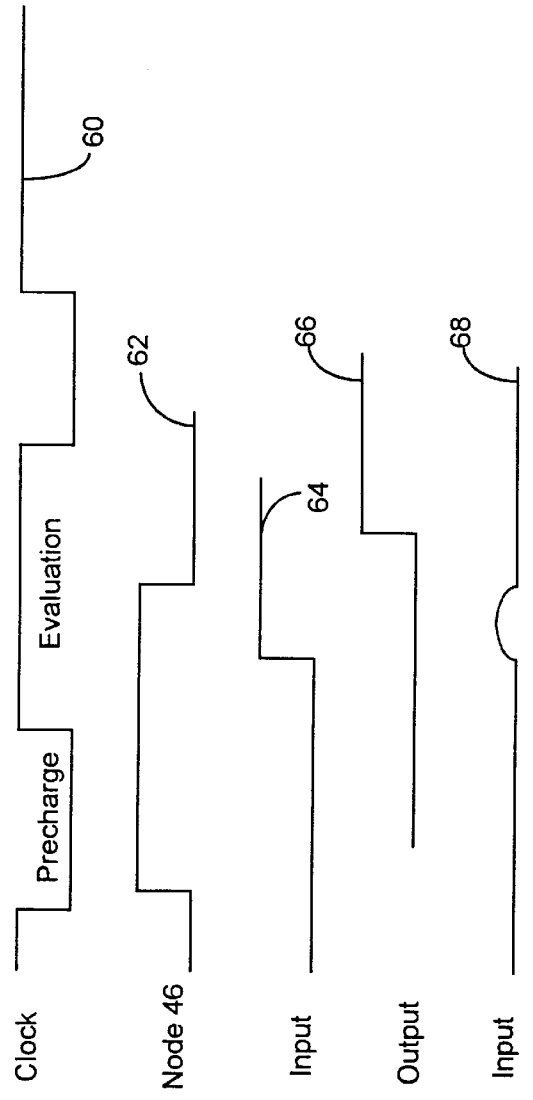
FIG. 3 is a set of timing diagrams demonstrating the operation of the circuit of FIG. 2.

This operation is more fully appreciated with reference to the waveforms of FIG. 3. Waveform 60 in FIG. 3 is a clock signal. The digital low value of the clock signal is referred to as a precharge phase. As indicated above, a digital low value of the clock signal causes the PMOS transistor 40 to turn-on and the NMOS transistor 44 to turn-off. Consequently, precharge node 46 is precharged, as shown with waveform 62. After the node 46 is precharged, the evaluation phase of the dynamic logic cycle is entered. That is, logic evaluation occurs during the evaluation phase, which corresponds to the digital high value of the clock signal.

Suppose that a digital high input signal is applied to the gate of transistor 42 during the evaluation phase, as shown with the waveform 64 of FIG. 3. In this case, the NMOS transistor 42 is turned-on by the digital high input signal and the NMOS transistor 44 is turned-on by the digital high clock signal. As a result, the voltage on the precharge node 46 is "pulled-down" through the transistors 42 and 44. In other words, the precharge node 46 assumes a digital low value, as shown at the end of the waveform 62 of FIG. 3.

This digital low value is then applied to the input nodes of transistors 52 and 54, which form a static inverter. The output of the static inverter is the repeater output node 56. As indicated above, during the precharge phase of the clock cycle, precharge node 46 has a digital high value. Consequently, the NMOS transistor 54 is turned-on and the PMOS transistor 52 is turned-off. This causes the repeater output node 56 to have a digital low value.

FIG. 3 illustrates that during the evaluation phase, the signal 62 on node 46 goes low. This operation causes the NMOS transistor 54 to turn-off and the PMOS transistor 52 to turn-on. As a result, the output node 56 experiences a low-to-high transition, as shown with waveform 66.

In sum, the dynamic logic signal repeater 33 has a dynamic inverter including transistors 40, 42 and 44. The precharge node 46 is precharged during a precharge clock cycle. During an evaluation clock cycle, the precharge node 46 inverts the input signal. The inverted input signal is applied to a static inverter comprising transistors 52 and 54. The inverted input signal is re-inverted by the static inverter, causing the original input signal to be driven on the repeater output node 56.

The problem with the dynamic logic signal repeater 33 of FIG. 2 is that noise, as shown by the bump in waveform 68 of FIG. 3, can cause the transistor 42 to turn-on. Thus, a digital low input signal with a noise component applied to the gate of transistor 42 can erroneously produce a digital high output signal at the repeater output node 56.

To prevent this from happening, the input line to the gate of transistor 42 may be shielded or distanced from other lines to reduce noise, as discussed above. Another technique to avoid this problem is to use a precharge node feedback device, shown in FIG. 2 as a precharge feedback transistor 50. The feedback transistor 50 is connected to a feedback inverter 48. These devices operate as follows.

A noise signal applied to the gate of transistor 42 may cause the transistor 42 to begin to turn-on. Consequently, the voltage on node 46 begins to drop. However, the digital high value on the precharge node 46 causes the feedback inverter 48 to apply a digital low value to the gate of the precharge feedback transistor 50, keeping the feedback transistor 50 turned-on. The precharge feedback transistor 50 is thereby used to replenish any lost voltage on the precharge node 46.

The problem with this approach is that the precharge feedback transistor 50 tends to counteract the operation of the transistor 42, causing the signal repeater 33 to operate more slowly. This approach also has the shortcoming that a large enough noise signal will cause the voltage on the precharge node 46 to fall sufficiently such that the feedback inverter 48 generates a digital high signal. In this case, the precharge feedback transistor 50 is turned-off and the replenishing effect of the precharge feedback transistor 50 is lost.

Figure 4:
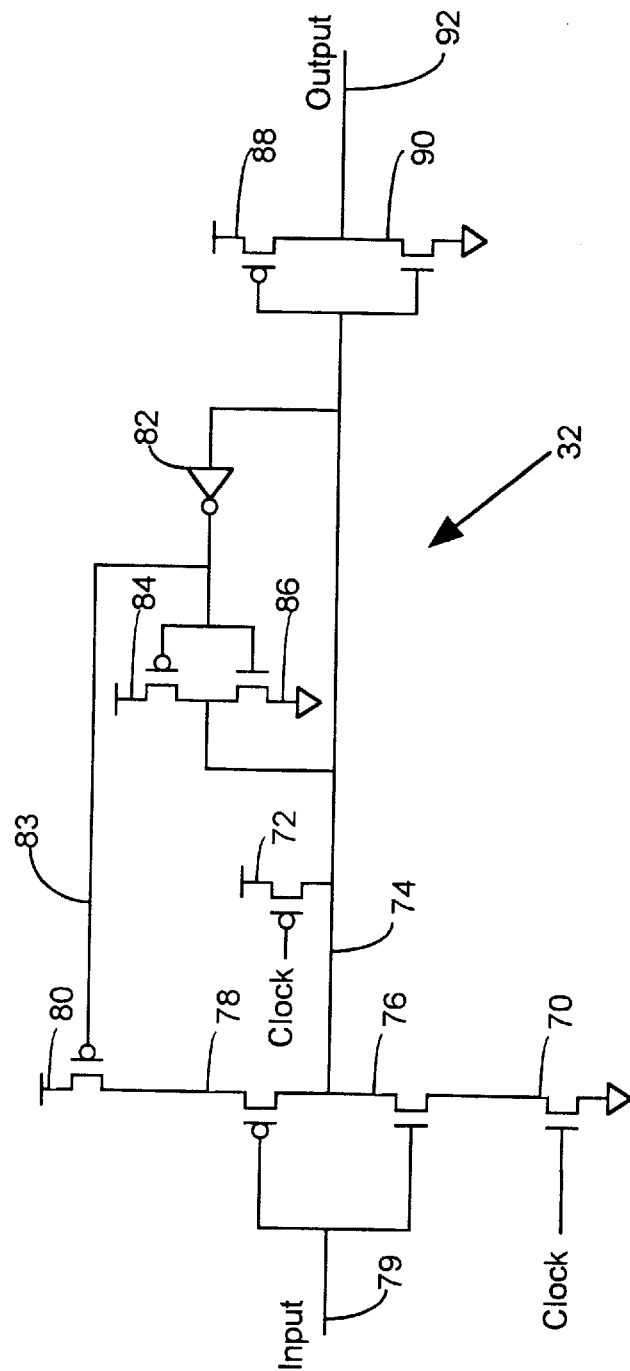
FIG. 4 illustrates a dynamic logic signal repeater in accordance with one embodiment of the invention.

The problems associated with the dynamic logic repeater 33 of FIG. 2 are largely eliminated with the dynamic logic repeater 32 of the invention, one embodiment of which is illustrated in FIG. 4.

The dynamic logic repeater 32 of FIG. 4 includes transistors 70 and 72, which receive an input clock signal. When the input clock signal is in the precharge phase with a digital low value, the PMOS transistor 72 is turned-on, causing the precharge node 74 (also referred to herein as an output node) to be charged to the value of the supply voltage.

Figure 5:
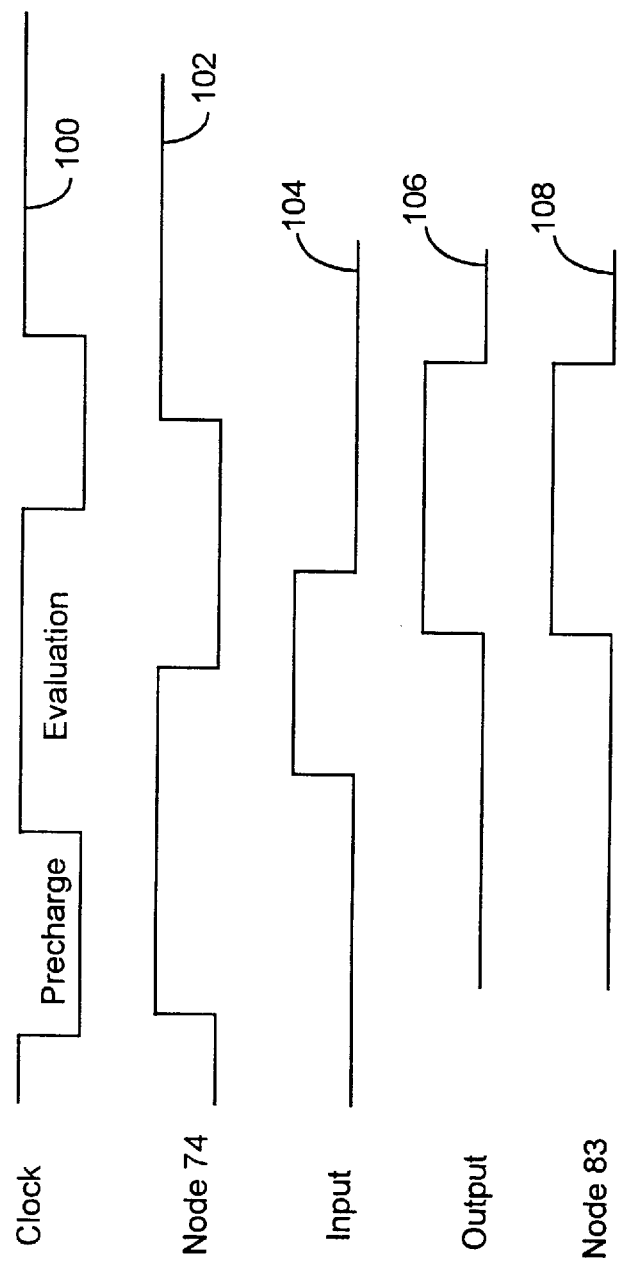
FIG. 5 is a set of timing diagrams demonstrating the operation of the circuit of FIG. 4.

FIG. 5 illustrates clock signal waveform 100. It also illustrates that the precharge node 74 has a signal 102 that goes from a digital low value to a digital high value during the precharge phase. During the evaluation phase, the clock signal is high, causing the PMOS transistor 72 to turn-off, and the NMOS transistor 70 to turn-on.

The dynamic signal repeater 32 of FIG. 4 achieves high noise immunity in the evaluation phase for a number of reasons. First, a complementary dynamic logic circuit comprising transistors 76 and 78 is used. This configuration along with the sizing of the transistors 76 and 78 improves noise immunity. Further noise immunity is achieved through the use of a precharge driver. These features are discussed below.

When the evaluation phase commences, the precharge node 74 has a digital high value, as shown with waveform 102 of FIG. 5. This causes inverter 82 to generate a digital low output signal that is applied to an evaluation locking transistor 80. In the embodiment of FIG. 4, the evaluation locking transistor 80 is a PMOS transistor, thus it is turned-on. Note also that during the precharge phase and when the evaluation phase begins, a digital low signal is applied to the input node 79. Thus, the PMOS pull-up transistor 78 is also turned-on. Consequently, at the beginning of the evaluation phase the PMOS transistor 80 and the PMOS transistor 78 are both turned-on, maintaining the precharge node 74 at the value of the supply voltage. The PMOS transistor 80 and the PMOS transistor 78 may be considered as precharge drivers because they maintain the charge on the output node 74. That is, even if noise causes NMOS pull-down transistor 76 to begin to turn-on, the precharge drivers (PMOS transistor 78 and PMOS transistor 80) will replenish any lost charge at the output node 74. This operation complements the operation of the standard precharge node feedback device, shown as precharge feedback transistor 50 in FIG. 2 and as PMOS transistor 84 in FIG. 4.

In sum, the precharge drivers (PMOS transistor 78 and PMOS transistor 80) provide immunity from noise at the input node 79. Noise immunity is also achieved through the use of the complementary transistors 76 and 78. Noise immunity is further enhanced if the size of the PMOS pull-up transistor 78 is approximately twice as large as the size of the NMOS pull-down transistor 76. In such a configuration, the NMOS pull-down transistor 76 has less strength to pull the precharge node 74 low, while the PMOS pull-up transistor 78 has more capacity to keep the precharge node 74 charged.

In view of the foregoing, the dynamic logic repeater 32 of the invention has relatively large noise immunity. Indeed, using the disclosed configuration, a signal transition will occur on the output node 74 only after an input signal is received with a magnitude substantially equivalent to the magnitude of an input signal required to generate a signal transition with static logic. In other words, the dynamic logic repeater 32 of the invention has a signal transition trip point that is substantially equivalent to the signal transition trip point of a static logic circuit.

The operation of the circuit is further appreciated with reference to an example input signal. Suppose that a digital high input signal is applied to the input node 79 of repeater 32. The input node 79 is connected to the gates of the NMOS pull-down transistor 76 and the PMOS pull-up transistor 78, which in combination form the complementary dynamic logic circuit of the invention. The output node of the NMOS pull-down transistor 76 is the same as the output node of the PMOS pull-up transistor 78. This output node is shown as node 74 in FIG. 4 and is also referred to as the precharge node.

A digital high input signal, shown as waveform 104 in FIG. 5, causes the NMOS pull-down transistor 76 to be turned-on, and the PMOS pull-up transistor 78 to be turned-off. The PMOS pull-up transistor 78 cuts off the supply voltage to the precharge node 74. Simultaneously, the NMOS pull-down transistor 76 turns on and the NMOS transistor 70 is turned-on from the digital high clock signal, thus the precharge node 74 is pulled-down to a digital low value, as shown with waveform 102 of FIG. 5.

Thus, the NMOS pull-down transistor 76 and the PMOS pull-up transistor 78, collectively the complementary dynamic logic circuit, invert the value of the input signal.

Referring to FIG. 5, it can be seen that the input signal waveform 104 causes the signal on node 74 to go from a digital high to a digital low value. The digital low value on the output node 74 is applied to a static inverter comprising the PMOS transistor 88 and NMOS transistor 90. The digital low value causes the PMOS transistor 88 to turn-on and the NMOS transistor 90 to turn-off. This operation forces the repeater output node 92 to become charged to the value of the supply voltage. Waveform 106 of FIG. 5 illustrates the signal driven at output node 92.

A problem with the use of the complementary dynamic logic circuit (NMOS pull-down transistor 76 and PMOS pull-up transistor 78) of the invention is that it is susceptible to a violation of a dynamic logic protocol. For example, suppose that the input signal goes from a digital high value to a digital low value during the evaluation period, as shown in FIG. 5. This causes the PMOS pull-up transistor 78 to turn-on. In a standard configuration, the PMOS pull-up transistor 78 would have its source tied to a voltage source. Consequently, the PMOS pull-up transistor 78 would begin to charge the output node 74 during the evaluation period, in violation of a dynamic logic protocol.

The present invention avoids this problem through the use of the evaluation locking transistor 80. The evaluation locking transistor 80 prevents the precharging of the output node 74, even if the PMOS pull-up transistor 78 is turned-on. The inverter 82 of the repeater 32 causes the signal on node 83 to be identical to the signal on the output node 92. This phenomenon is illustrated with waveforms 106 and 108 of FIG. 5. Note that node 83 will have a digital high value even when the input signal waveform 104 goes from a digital high to a digital low value. Consequently, the evaluation locking transistor 80 remains off. Thus, the PMOS pull-up transistor 78 does not receive a charge, even if it is turned-on.

Consequently, it can be appreciated that the evaluation locking transistor 80 serves a dual and synergistic purpose. First, it prevents the PMOS pull-up transistor 78 from turning on when an input signal goes low during the evaluation phase of a clock signal. Consequently, the evaluation locking transistor 80 prevents the precharge node 74 from charging during the evaluation phase. Second, the evaluation locking transistor 80 operates as a precharge driver, improving the noise immunity of the dynamic logic repeater 32, as previously discussed.

The dynamic logic repeater 32 of FIG. 4 includes a latch comprised of transistors 84 and 86. As previously indicated, the PMOS transistor 84 operates as a precharge node feedback device to supplement the operation of the precharge drivers (transistors 78 and 80). The NMOS transistor 86 holds a digital low value at node 74 during the evaluation period when the input has gone from high to low. In this way, the NMOS transistor 86 adds to the noise immunity robustness of the repeater 32. The latch comprised of transistors 84 and 86 also operates in a conventional manner to latch or hold the input signal.

Those skilled in the art will appreciate that the invention provides an improved high noise immunity dynamic logic signal repeater. The dynamic logic signal repeater allows for a device that is more compact than a device that relies upon distancing or shielding to achieve noise immunity. The invention does not sacrifice device speed, as in the case of a high strength precharge node feedback device. Advantageously, the invention can be implemented through modifications to existing dynamic logic signal repeater architectures.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. A dynamic logic signal repeater, comprising:
   a complementary dynamic logic circuit with an input node to receive an input signal and an output node storing a precharge signal, said complementary dynamic logic circuit creating a relatively high signal transition trip point for said precharge signal on said output node; and
   an evaluation locking transistor connected to said complementary dynamic logic circuit and said output node, said evaluation locking transistor operating with said complementary dynamic logic circuit as a precharge driver to facilitate said relatively high signal transition trip point.

2. The apparatus of claim 1 wherein said complementary dynamic logic circuit is a complementary dynamic logic inverter.

3. The apparatus of claim 2 wherein said complementary dynamic logic inverter includes
   an NMOS pull-down transistor connected to said input node and said output node; and
   a PMOS pull-up transistor connected to said input node and said output node.

4. The apparatus of claim 3 wherein said PMOS pull-up transistor is approximately twice as large as said NMOS pull-down transistor.

5. The apparatus of claim 1 wherein said evaluation locking transistor selectively prevents the charging of said output node during a dynamic logic evaluation period.

6. The apparatus of claim 1 wherein said relatively high signal transition trip point is substantially equivalent to the signal transition trip point of a static logic circuit.

7. The apparatus of claim 1 further comprising a static inverter with a static inverter input node connected to said output node and a static inverter output node forming the output of said dynamic logic signal repeater.

8. The apparatus of claim 1 further comprising a latch with a latch input node connected to said output node and a latch output node connected to said output node.

9. The apparatus of claim 1 further comprising an inverter connected between said output node and said evaluation locking transistor.

10. The apparatus of claim 1 wherein said dynamic logic signal repeater is formed in the central processing unit of a general purpose computer.

11. A method of constructing a dynamic logic signal repeater, said method comprising the steps of:
    providing a complementary dynamic logic circuit with an input node to receive an input signal and an output node storing a precharge signal, said complementary dynamic logic circuit creating a relatively high signal transition trip point for said precharge signal on said output node; and
    providing an evaluation locking transistor connected to said complementary dynamic logic circuit and said output node, said evaluation locking transistor selectively preventing the charging of said output node during a dynamic logic evaluation period.

12. The method of claim 11 further comprising the step of providing a complementary dynamic logic circuit that is a complementary dynamic logic inverter.

13. The method of claim 12 further comprising the step of providing said complementary dynamic logic inverter with
an NMOS pull-down transistor connected to said input node and said output node; and
a PMOS pull-up transistor connected to said input node and said output node.

14. The method of claim 13 further comprising the step of providing said PMOS pull-up transistor with a size that is approximately twice as large as the size of said NMOS pull-down transistor.

15. The method of claim 14 further comprising the step of using said PMOS pull-up transistor and said evaluation locking transistor as precharge drivers to facilitate said relatively high signal transition trip point.

16. A method of improving the noise immunity of a dynamic logic signal repeater, said method comprising the steps of:
establishing, with a dynamic logic circuit, a signal transition trip point for a precharge signal on a dynamic logic precharge node that is substantially equivalent to the signal transition trip point of a static logic circuit; and
preventing said dynamic logic precharge node from charging during a dynamic logic evaluation period.

17. The method of claim 16 wherein said establishing step is performed with a complementary dynamic logic inverter including
an NMOS pull-down transistor of a first size connected to said input node and said output node; and
a PMOS pull-up transistor of a second size connected to said input node and said output node, said second size being approximately twice as large as said first size.

18. The method of claim 17 further comprising the step of using said PMOS pull-up transistor and an evaluation locking transistor as precharge drivers to increase the level of said signal transition trip point.

19. The method of claim 18 wherein said using step generates a signal transition trip point that is substantially equivalent to the signal transition trip point of a static logic circuit.

20. The method of claim 16 further comprising the step of operating said dynamic logic signal repeater in the central processing unit of a general purpose computer.

* * * * *

UNITED STATES PATENT AND TRADEMARK OFFICE
CERTIFICATE OF CORRECTION

PATENT NO. : 5,889,417

DATED : March 30, 1999

INVENTOR(S) : Klass et al.

It is certified that error appears in the above-identified patent and that said Letters Patent is hereby corrected as shown below:

Column 8, line 1, before "preventing", please insert --selectively--

Signed and Sealed this

Seventh Day of September, 1999

*Attest:*

Q. TODD DICKINSON

*Attesting Officer*  Acting Commissioner of Patents and Trademarks